(12) United States Patent
Restaino et al.

(10) Patent No.: US 6,176,931 B1
(45) Date of Patent: Jan. 23, 2001

(54) WAFER CLAMP RING FOR USE IN AN IONIZED PHYSICAL VAPOR DEPOSITION APPARATUS

(75) Inventors: Darryl D. Restaino, Modena; Stephen Mark Rossnagel, Pleasantville; Andrew Herbert Simon, Fishkill; Pavel Smetana, Poughkeepsie, all of NY (US); Edward C. Cooney, III, Jericho, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/430,829

(22) Filed: Oct. 29, 1999

(51) Int. Cl.[7] .............................. C23C 16/00; C23C 14/00
(52) U.S. Cl. ..................... 118/715; 118/500; 118/724; 204/298.01
(58) Field of Search .................................. 118/725, 500, 118/504, 503, 52, 728, 724, 715, 716, 723 E; 156/345; 204/192.1, 192.12, 298.01, 298.06

(56) References Cited

U.S. PATENT DOCUMENTS

| | | | |
|---|---|---|---|
| 4,086,870 | 5/1978 | Canavello et al. | 118/52 |
| 4,189,230 | 2/1980 | Zasio . | |
| 4,282,924 | 8/1981 | Faretra | 165/80 |
| 4,473,455 | 9/1984 | Dean et al. . | |
| 4,592,308 | 6/1986 | Shih et al. | 118/726 |
| 4,671,204 | 6/1987 | Ballou | 118/59 |
| 4,975,621 | 12/1990 | Fukubayashi et al. | 313/633 |
| 5,094,885 | 3/1992 | Selbrede | 427/248 |
| 5,183,402 | 2/1993 | Cooke et al. | 432/5 |
| 5,228,501 | 7/1993 | Tepman et al. | 165/80.1 |
| 5,238,499 | 8/1993 | van de Ven et al. | 118/724 |
| 5,262,029 | 11/1993 | Erskine et al. . | |
| 5,304,248 | 4/1994 | Cheng et al. | 118/728 |
| 5,316,278 | 5/1994 | Sherstinsky et al. | 269/254 |
| 5,326,725 | * 7/1994 | Sherstinsky et al. | 118/725 |
| 5,391,275 | 2/1995 | Mintz | 204/192.32 |
| 5,405,491 | 4/1995 | Shahvandi et al. . | |
| 5,421,401 | 6/1995 | Sherstinsky et al. | 165/80.2 |
| 5,437,757 | 8/1995 | Rice et al. | 156/345 |
| 5,460,703 | 10/1995 | Nulman et al. | 204/192.12 |
| 5,476,548 | 12/1995 | Lei et al. | 118/728 |
| 5,484,011 | 1/1996 | Tepman et al. | 165/1 |
| 5,534,072 | 7/1996 | Mizuno et al. | 118/728 |
| 5,534,110 | 7/1996 | Lenz et al. | 156/643.1 |
| 5,578,164 | 11/1996 | Kurono et al. | 156/643.1 |
| 5,632,873 | 5/1997 | Stevens et al. . | |
| 5,695,567 | * 12/1997 | Kordina et al. | 118/725 |
| 5,711,815 | 1/1998 | Lee et al. | 118/725 |
| 5,762,714 | 6/1998 | Mohn et al. | 118/728 |
| 5,810,931 | 9/1998 | Stevens et al. | 118/721 |
| 5,851,299 | 12/1998 | Cheng et al. | 118/729 |
| 5,972,114 | * 10/1999 | Yonenaga et al. | 118/715 |

FOREIGN PATENT DOCUMENTS

0452779A2  10/1991  (EP) .

* cited by examiner

Primary Examiner—Gregory Mills
Assistant Examiner—Parviz Hassanzadeh
(74) Attorney, Agent, or Firm—Jay H. Anderson

(57) ABSTRACT

Improvements are described for a wafer clamp ring used in an IPVD apparatus to provide cooling for the wafer clamp ring, to protect the wafer clamp ring from ion bombardment, and to prevent damage to the wafer. The wafer clamp ring is placed on a cooling fixture when not required for a deposition process. The fixture is annular in shape and in close thermal contact with a circulating coolant and is thereby cooled below ambient temperature. The cooling line and the cooling fixture are fixed relative to the IPVD device, so that problems associated with flexible cooling lines are avoided. An annular grounded shield may be provided between the plasma and clamp ring to protect the clamp ring against ion bombardment during the deposition process. The wafer clamp ring may have a portion which overhangs the wafer during a deposition process, and which has a ridge portion extending downwards therefrom and tapering to a knife edge. The wafer clamp ring may be fabricated as a split ring with an insulating portion, to prevent heating by induced current in the clamp ring.

21 Claims, 3 Drawing Sheets

WAFER CLAMP RING FOR USE IN AN IONIZED PHYSICAL VAPOR DEPOSITION APPARATUS

RELATED APPLICATIONS

This application is related to application Ser. Nos. 09/430,830 and 09/430,831, filed the same day and assigned to the same assignee as the present application. The disclosures of these related applications are incorporated herein by reference.

FIELD OF THE INVENTION

This invention relates to improvements in a wafer clamp ring used in ionized physical vapor deposition (IPVD) apparatus, which are widely used in the fabrication of semiconductor devices.

BACKGROUND OF THE INVENTION

Physical vapor deposition (PVD or sputtering) is a well-known process for depositing thin solid films on substrates, and is widely practiced in the semiconductor industry. Ionized physical vapor deposition (IPVD), also referred to as ionized metal plasma (IMP) deposition, has been used more recently to deposit metal films (notably copper) in etched structures such as vias and contact holes. IMP deposition apparatus differs from earlier versions of PVD apparatus in that a dense plasma is used to ionize the metal atoms during the sputter deposition process.

A typical IPVD arrangement is shown schematically in FIG. 1. In an IPVD apparatus 100, a flux of metal atoms 101 is produced by sputtering from a target 102. These atoms are ionized by passing through a plasma 103, and are deposited on a sample 1 (typically a silicon wafer). The ions 104 are transported from the plasma to the wafer by means of a negative potential on the sample relative to the plasma. IPVD devices differ from conventional PVD devices in that during an IPVD process, the metal ions have additional kinetic energy because of the potential difference between the plasma and the sample (typically 5 to 15 volts).

In order to maintain a uniform potential difference between the plasma and the wafer, and to control the temperature of the wafer, the wafer is clamped against a cooled pedestal 111 using a clamp ring 110. In one arrangement known in the art, the pedestal is mounted on an elevator mechanism, and is moved vertically upwards from an "idle" position to a "process" position where the weight of the clamp ring is borne by the outer edge of the wafer. (FIG. 1 shows the wafer and pedestal in the "process" position.) The clamp ring is typically several pounds in weight and has an inside diameter slightly smaller than the diameter of the wafer.

The plasma potential is always more positive than the potential of the sample or the various fixtures in the process chamber, including the clamp ring 110. The clamp ring is in mechanical and electrical contact with the wafer 1; a flexible conductor 114 touching the pedestal and the underside of the clamp ring ensures electrical contact therebetween. Accordingly, the clamp ring is subject to ion bombardment from the plasma, which tends to heat the clamp ring. In addition, the sample 1 and pedestal 111 are often connected to a biasing power source (not shown); a portion of the bias power is dissipated in the clamp ring 110, further adding to heating of the clamp ring. For a typical commercial 200 mm wafer IPVD system, the clamp ring might receive as much as 50% of the applied bias power of 500 W. Measurements using thermocouples attached to the clamp ring have shown that the clamp ring may reach a temperature of 300° C. during a deposition process.

Heating of the clamp ring is undesirable for several reasons. Thermal expansion of the ring, relative to the wafer, results in changes in the size of the shadowed edge region of the wafer. The clamp ring may warp due to thermal expansion, thus shortening its operating life.

Furthermore, since the clamp ring is subject to metal ion bombardment, a metal film is deposited on the clamp ring which typically has thermal expansion properties different from those of the clamp ring material. The heating of the clamp ring is cyclical (heating during a deposition process, cooling between deposition processes). This results in stresses in the films deposited on the clamp ring, which in turn may result in the film breaking and forming particles.

Active cooling of the clamp ring is difficult, since the IPVD process chamber is a clean, ultrahigh vacuum environment. The ring is moved within the process chamber to clamp and unclamp the wafer at the beginning and end of each deposition process. Accordingly, using water-cooling lines in contact with the clamp ring is not desirable, since those lines would flex with the movement of the clamp ring, and eventually leak or generate particles.

Another problem related to the clamp ring is that of clamp ring/wafer sticking. This effect has been observed in IPVD of copper and aluminum films. As shown in FIG. 1, a typical clamp ring has a portion 110a which overhangs the point of contact between the wafer and the clamp ring, thereby protecting this point from film deposition so that the wafer does not "weld" to the clamp ring. However, if the clamp ring does not properly contact the wafer (due to thermal expansion, eccentric wafer location on the pedestal, etc.) one side of the wafer may instead contact surface 110b on the overhanging portion of the clamp ring. In that event the wafer may stick to surface 110b. This usually leads to breakage of the wafer. Besides the loss of a valuable product wafer, the IPVD tool becomes contaminated with wafer debris and is unavailable for a substantial period of time.

There is a need for an improved wafer clamp ring arrangement in IPVD devices which reduces or avoids the problems of clamp ring heating and clamp ring/wafer sticking.

SUMMARY OF THE INVENTION

The present invention addresses the above-described need by providing a cooling structure for a wafer clamp ring, and a shield for a wafer clamp ring, so that thermal expansion and ion bombardment of the wafer clamp ring is reduced or avoided.

In accordance with a first aspect of the present invention, a cooling fixture is provided on which the wafer clamp ring is placed when the wafer clamp ring is not required for a deposition process. The fixture is annular in shape and has dimensions substantially identical to a bottom surface of the wafer clamp ring. The fixture is in close thermal contact with a circulating coolant and is thereby cooled below ambient temperature. The bottom surface of the wafer clamp ring is brought into close thermal contact with a top surface of the fixture when the wafer clamp ring is placed thereon, so that the wafer clamp ring is cooled below ambient temperature when not required for a deposition process.

Furthermore, the conductor for the coolant and the cooling fixture are fixed relative to the IPVD device, so that problems associated with flexible cooling lines are avoided. The top surface of the fixture may have a sloped portion with an inner diameter substantially identical to an outer diameter of the wafer clamp ring, which has the advantage of causing the wafer clamp ring to be centered relative to the fixture when the wafer clamp ring is placed thereon.

In accordance with a second aspect of the invention, a shield is provided for the wafer clamp ring, to protect the wafer clamp ring against ion bombardment during the deposition process. The shield is located between the plasma and the wafer clamp ring and is annular in shape; the inside diameter of the shield and the inside diameter of the wafer clamp ring are substantially identical. The wafer clamp ring is at a bias potential and the shield is at ground potential during the deposition process. This shield may be attached to a generally cylindrical shield which surrounds the wafer clamp ring during the deposition process.

In accordance with a further aspect of the invention, a wafer clamp ring is provided in which contact between the wafer and wafer clamp ring during a deposition process is minimized. The wafer clamp ring has an annular first portion with an inner diameter less than a diameter of the wafer, and a bottom surface in contact with the wafer during the deposition process. An annular second portion, with an inner diameter less than that of the first portion, is connected to the first portion so as to overhang the wafer during the deposition process. A ridge portion extends downwards from the second portion and tapers to a knife edge. This wafer clamp ring may also include a shield as described just above.

According to a further aspect of the invention, the shield or wafer clamp ring (whichever is exposed to ion bombardment from the plasma) may be made of the same material as the material deposited on the wafer; be coated with a high-emissivity material; or have a surface with a texture facilitating radiative cooling from that surface.

According to another aspect of the invention, a wafer clamp ring is provided which has first and second portions. The first portion is of a conductive material and has an annular shape with a gap extending from the inner circumference to the outer circumference of the annular shape, so that the first portion is discontinuous in the circumferential direction. The second portion is of an insulating material disposed in the gap, so that induced current in the circumferential direction is prevented.

DETAILED DESCRIPTION OF THE PREFERRED EMBODIMENTS

Figure 1:
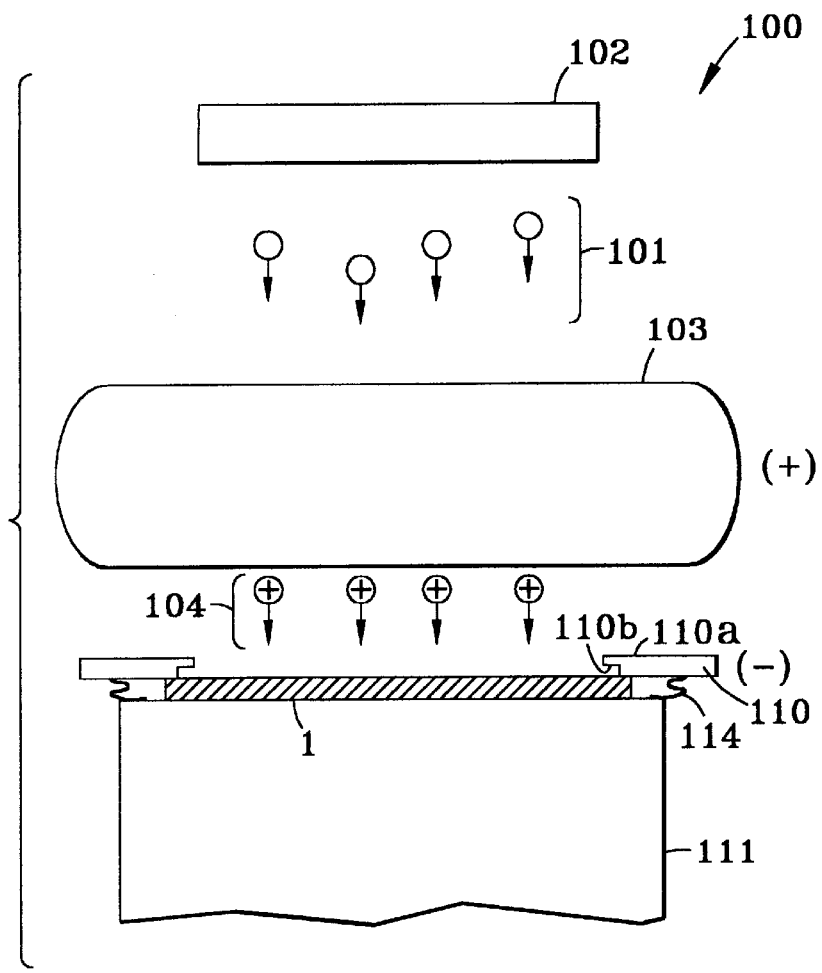
FIG. 1 is a schematic illustration of a typical ionized physical vapor deposition (IPVD) process.
Figure 2:
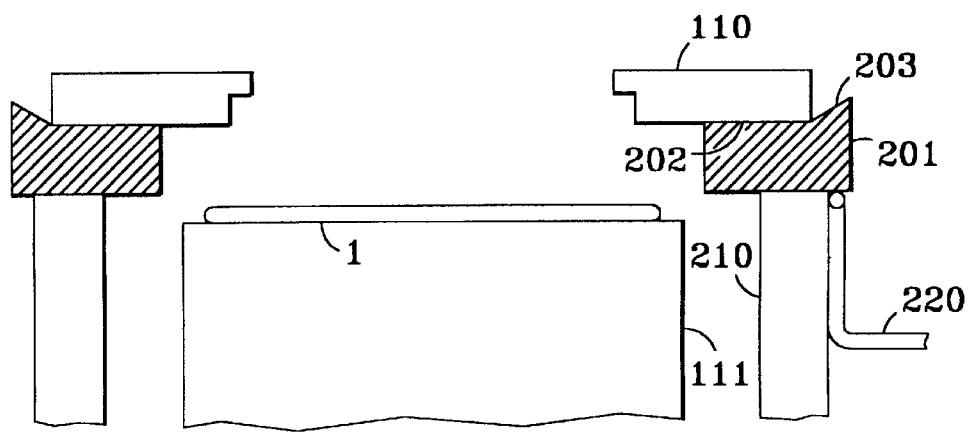
FIG. 2 is a schematic cross-sectional view of a cooling fixture for a wafer clamp ring in accordance with an embodiment of the present invention.

An arrangement for cooling the wafer clamp ring in accordance with the present invention is shown schematically in FIG. 2. When a wafer is not being processed in the IPVD deposition chamber, the pedestal 111 is lowered to an "idle" position; as the pedestal is lowered, the clamp ring 110 comes to rest on a water-cooled fixture 201. The cooled fixture is ring-shaped and is preferably made of a material with high thermal conductivity, such as Al or Cu. The top surface 202 of the cooled fixture 201 should be smooth, in order to maximize the area of contact between the surface 202 and the bottom surface of clamp ring 110. Furthermore, the outer portion 203 of fixture 201 may be sloped, to provide mechanical re-centering of the clamp ring 110 after each wafer is processed. The inner diameter of sloped portion 203 is substantially identical to the outer diameter of wafer clamp ring 110, as shown in FIG. 2. It will be appreciated that it is preferable to re-center the clamp ring while it is not in contact with the wafer; otherwise, centering the clamp ring with respect to the wafer would involve scraping the clamp ring laterally across the wafer surface, inevitably generating unwanted particles.

The cooled fixture 201 is rigidly fixed to the IPVD apparatus by a support bracket 210. Support bracket 210 is preferably arranged so that it is shielded from ion bombardment by the fixture 201 and wafer clamp ring 110 during the IPVD process. A water cooling line 220, shown schematically in FIG. 2, is led from the outside of the process chamber and is in close thermal contact with bracket 210, and thus with fixture 201. The water cooling line may either be underneath the fixture 201 (as shown in FIG. 2) or integrated with the bracket 210. In either case, the cooling line 220 should be shielded from deposition of metal atoms or ions, in order to avoid particulate formation. It should be noted that fixture 201 and cooling line 220 are fixed with respect to the IPVD apparatus; that is, no flexible cooling lines are used.

Fixture 201 alternatively may be located in another chamber adjacent to the deposition chamber, depending on the overall design of the IPVD device. For example, if the IPVD device has a fixed pedestal and a robotic mechanism is used to place the wafer thereon, the robotic mechanism may be used to move the clamp ring between the pedestal and the cooled fixture.

Typically, a wafer is present in the deposition chamber between 25% and 75% of the time, depending primarily on the length of the deposition process. During the time between deposition processes, when there is no wafer in the chamber, the clamp ring 110 is cooled below room temperature by contact with the fixture 201. Accordingly, the clamp ring is heated during the deposition process, but its temperature does not rise significantly above room temperature. Thermal expansion of the clamp ring and growth of the edge-shadowed region are therefore avoided. Another benefit is that the problem of wafer/clamp ring sticking is avoided.

Figure 3A:
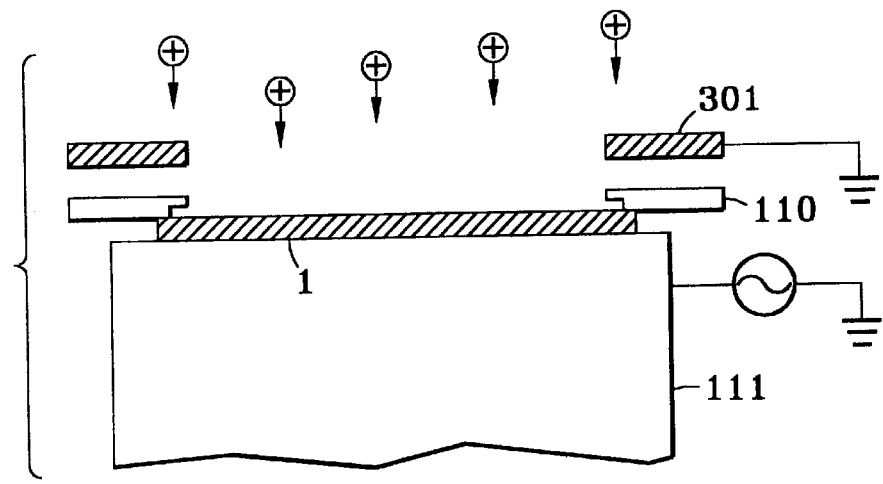
FIGS. 3A and 3B are schematic illustrations of a grounded shield provided for a wafer clamp ring, in accordance with another embodiment of the invention.
Figure 3B:
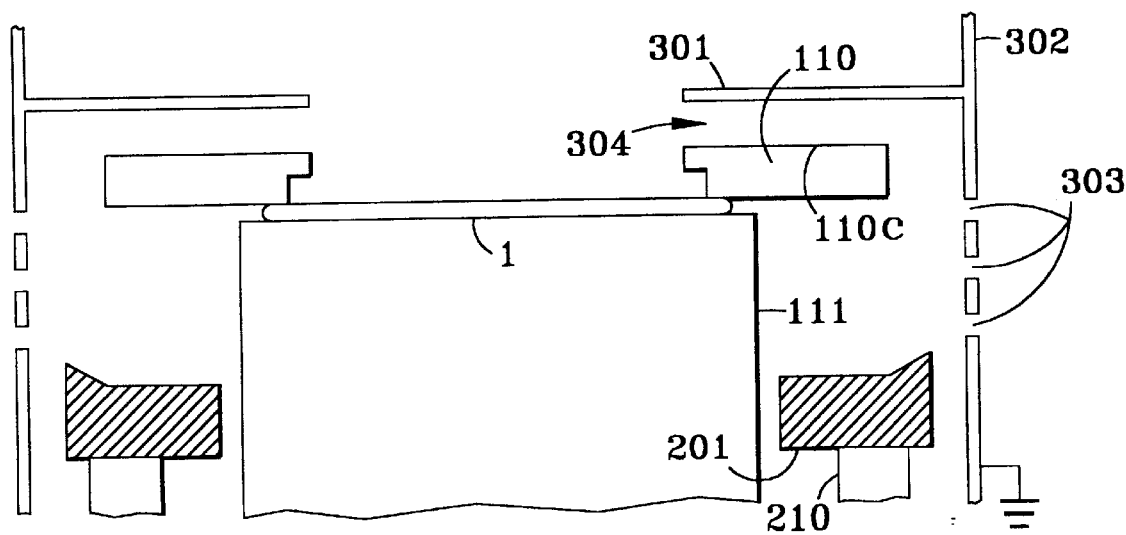

FIGS. 3A and 3B illustrate an additional embodiment of the invention. As noted above, clamp ring 110 dissipates a portion of the substrate bias power, and is subject to bombardment by metal ions during the IPVD process. To protect the clamp ring from ion bombardment and further reduce unwanted heating, a grounded shield 301 may be placed above the clamp ring 110, between the clamp ring and the plasma, as shown in FIG. 3A. The shield 301 then absorbs the ions which would otherwise impact on the clamp ring 110. Shield 301 is in the shape of a ring with its inside diameter matching that of clamp ring 110.

Shield 301 may be mounted in the process chamber by any convenient means, provided that its mounting fixture is not exposed to ion bombardment. One possible arrangement is shown in FIG. 3B. Pedestal 111 and wafer 1 are shown elevated into the "process" position, with clamp ring 110 resting on the wafer and facing the shield 301. Shield 301 is fixed to a generally cylindrical shield 302 which surrounds the pedestal and is perforated with holes 303 to permit the flow of process gases into the interior of the chamber. The holes 303 are protected from sputtered deposition by the shield 301. The grounded shield 301 is located with respect to the process position of the clamp ring 110 so as to form a gap 304. The size of the gap 304 is chosen to be small enough so that resputtered deposition on the top surface 110c of the clamp ring (as well as the areas external to the pedestal 111 and below the level of the wafer 1) is avoided. The material for shield 301 (and in FIG. 3B, shield 302 also) is preferably the same as the film being deposited on the wafer, in order to minimize the generation of foreign-matter particulate. Furthermore, shield 301 prevents ion bombardment and deposition on the clamp ring cooling fixture 201 and its support bracket 210.

It has been found that heating of the clamp ring is reduced by about 50% when a grounded shield is used. This benefit has been demonstrated at several bias power levels.

According to a further embodiment of the invention, the material used for those parts of the IPVD device exposed to ion bombardment is chosen to minimize damage due to cyclical heating. For example, if the material being deposited on the wafer is Cu, the clamp ring 110 and/or grounded shield 301 may also be made of Cu in order to match the thermal expansion properties of the deposited film. The temperature cycling of those parts will then not result in any significant change in film stress, so that film breakage and particle formation are avoided. In addition, deposited films of Cu will bond well to fixtures made of Cu, thereby further reducing the danger of particle formation in the deposition chamber.

The operating temperature of those parts of the IPVD device subject to ion bombardment may also be reduced by coating them with a high-emissivity material, or by finishing their surfaces with a texture that promotes radiative cooling.

Figure 4:
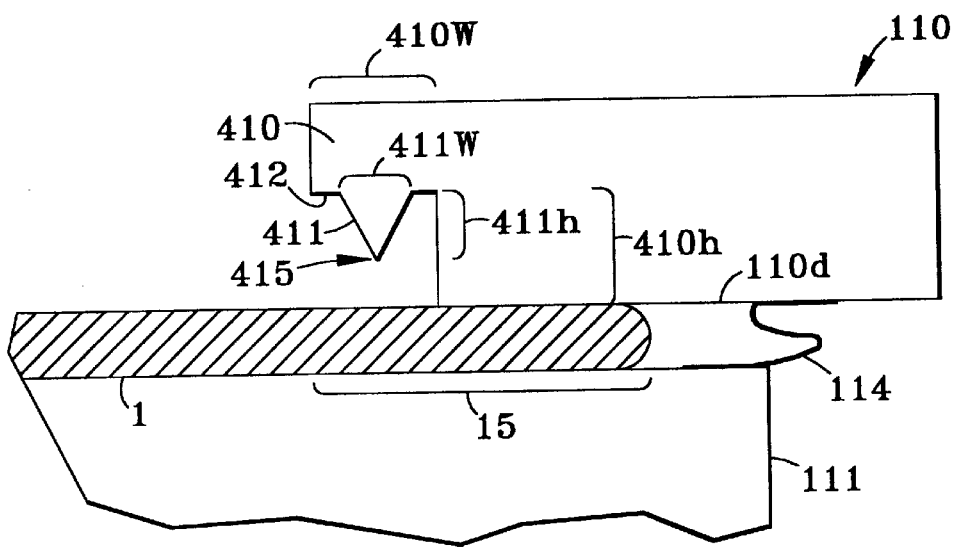
FIG. 4 is a detail view of a wafer clamp ring incorporating a ridge and a knife edge, in accordance with a further embodiment of the invention.

According to another embodiment of the invention, the problem of wafer 1 sticking to the underside of the clamp ring 110 may be avoided by minimizing the contact area between them. FIG. 4 shows a clamp ring 110 with a "roof" portion 410 which extends radially inward over wafer 1. Typically the portion 15 of the wafer shadowed by the clamp ring extends a few millimeters in the radial direction. The roof portion 410 has a ridge 411 extending downward towards the wafer, ending in a knife edge 415. In the event that the wafer 1 fails to be held down by the bottom surface 110d of the clamp ring, the wafer 1 will contact the underside of the roof portion, but only at the knife edge 415. The potential for the wafer sticking to the clamp ring is thereby reduced.

It has been found that the ridge 411 should preferably have a height 411h approximately half the roof height 410h, the distance from the bottom surface 110d of the clamp ring to the underside 412 of the roof portion 410 (see FIG. 4). The width 411w of the ridge should be approximately half the roof width 410w, the distance the roof portion projects radially inward. The ridge should be centered within the roof width, as shown in FIG. 4.

As noted above, the material of the clamp ring may be chosen to match the thermal expansion coefficient of the film being deposited, or of the wafer. In particular, a titanium clamp ring has been found to present fewer wafer sticking problems than a conventional stainless steel clamp ring, when an aluminum film is deposited on the wafer.

Figure 5A:
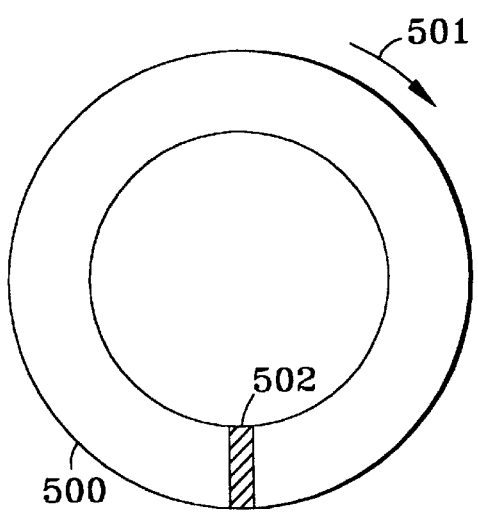
FIGS. 5A and 5B are schematic plan views of a wafer clamp ring including an insulating portion to prevent induced current, in accordance with another embodiment of the invention.
Figure 5B:
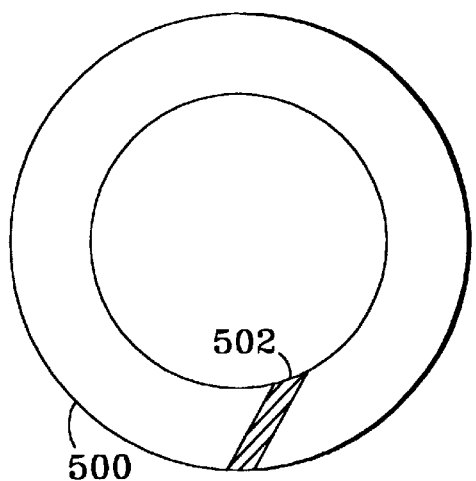

Since the wafer clamp ring 110 is typically made of an electrically conducting material, current may be induced in the ring during the IPVD process, further contributing to unwanted heating of the wafer clamp ring. For example, an RF coil is generally used to generate the plasma 103 in which the sputtered metal atoms are ionized; this coil is located above and parallel to the wafer clamp ring during the deposition process. Currents in the RF coil will thus induce current in the body of the wafer clamp ring, in the circumferential direction 501 (see FIG. 5A). This problem may be avoided by fabricating the wafer clamp ring as a split ring 500 with an insulating portion 502 in the gap thereof, as shown in FIGS. 5A and 5B. Since the insulating portion 502 extends from the top surface to the bottom surface of the wafer clamp ring, an induced current cannot travel around the ring in the direction 501.

In FIG. 5A, the split in the conducting material of the wafer clamp ring is in the radial direction, and insulating portion 502 has the same cross section as the remainder of the wafer clamp ring. Alternatively, insulating portion 502 may be at an angle with respect to the radial direction, as shown in FIG. 5B.

It should be noted that the top surface of the insulating piece 502 must be protected from metal deposition, or else a conducting bridge may be formed across which an induced current may travel. Accordingly, it is preferable to combine this arrangement of the wafer clamp ring with a shielding arrangement such as shown in FIG. 3B.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A device for cooling a wafer clamp ring used in an ionized physical vapor deposition (IPVD) apparatus, the wafer clamp ring holding the wafer on a wafer pedestal during a deposition process, the device comprising:

a cooling fixture on which the wafer clamp ring is placed when the wafer clamp ring is not required for a deposition process, said fixture being annular in shape and in close thermal contact with a circulating coolant and thereby cooled below ambient temperature, wherein the bottom surface of the wafer clamp ring is brought into close thermal contact with a top surface of the fixture when the wafer clamp ring is placed thereon, so that the wafer clamp ring is cooled below ambient temperature when not required for a deposition process and is then at a different position with respect to the wafer pedestal than during the deposition process.

2. A device according to claim 1, wherein the coolant is in a cooling line, and the cooling fixture and the cooling line are fixed relative to the IPVD device.

3. A device according to claim 1, wherein the top surface of the fixture has a sloped portion with an inner diameter substantially identical to an outer diameter of the wafer clamp ring, causing the wafer clamp ring to be centered relative to the fixture when the wafer clamp ring is placed thereon.

4. A wafer clamp ring assembly for use in an ionized physical vapor deposition (IPVD) device in which a plasma is formed to facilitate deposition of material on a wafer, the wafer clamp ring assembly comprising:

a wafer clamp ring for holding a wafer during a deposition process, the wafer clamp ring being annular in shape; and a shield for protecting the wafer clamp ring against ion bombardment during the deposition process, the shield being located between the plasma and the wafer clamp ring and being annular in shape, an inside diameter of the shield and an inside diameter of the wafer clamp ring being substantially identical, wherein the wafer clamp ring is at a bias potential and the shield is at ground potential during the deposition process.

5. A wafer clamp ring assembly according to claim 4, further comprising a generally cylindrical shield attached to said annular shield and surrounding the wafer clamp ring during the deposition process, said generally cylindrical shield having holes therein to facilitate flow of gases in the IPVD device.

6. A wafer clamp ring assembly according to claim 4, wherein the shield is of a same material as the material deposited on the wafer.

7. A wafer clamp ring assembly according to claim 4, wherein the shield is coated with a material having higher emissivity than the material of the shield.

8. A wafer clamp ring assembly according to claim 4, wherein at least one of the wafer clamp ring and the shield has a surface with a texture facilitating radiative cooling from said surface.

9. A wafer clamp ring assembly for holding a wafer during a deposition process in an ionized physical vapor deposition (IPVD) device in which a plasma is formed to facilitate deposition of material on the wafer, the wafer clamp ring comprising:

a first portion having an annular shape and having an inner diameter less than a diameter of the wafer, the first portion having a bottom surface in contact with the wafer during a deposition process;

a second portion having an annular shape and connected to the first portion so as to overhang the wafer during the deposition process, the second portion having an inner diameter less than the inner diameter of the first portion; and a ridge portion extending downwards from the second portion and tapering to a knife edge, the knife edge being disposed above the wafer and separated therefrom when the bottom surface of the first portion is in contact with the wafer.

10. A wafer clamp ring assembly according to claim 9, wherein the second portion has an underside facing the wafer during the deposition process and a height defined by a distance between said underside and the wafer, and the ridge portion extends vertically approximately half said height.

11. A wafer clamp ring assembly according to claim 9, wherein the second portion has a width defined by a radial distance between an inner surface of the first portion and an inner surface of the second portion, and the ridge portion extends radially approximately half said width.

12. A wafer clamp ring assembly according to claim 11, wherein the ridge portion is centered in the radial direction with respect to said width.

13. A wafer clamp ring assembly according to claim 9, wherein the wafer clamp ring is of a same material as the material deposited on the wafer.

14. A wafer clamp ring assembly according to claim 9, wherein the wafer clamp ring is coated with a material having higher emissivity than the material of the wafer clamp ring.

15. A wafer clamp ring assembly according to claim 9, wherein the wafer clamp ring has a surface with a texture facilitating radiative cooling from said surface.

16. A wafer clamp ring assembly according to claim 9, further comprising:

a shield for protecting the wafer clamp ring against ion bombardment during the deposition process, the shield being located between the plasma and the wafer clamp ring and being annular in shape, an inside diameter of the shield and an inside diameter of the wafer clamp ring being substantially identical, wherein the wafer clamp ring is at a bias potential and the shield is at ground potential during the deposition process.

17. A wafer clamp ring assembly according to claim 16, further comprising a generally cylindrical shield attached to said annular shield and surrounding the wafer clamp ring during the deposition process, said generally cylindrical shield having holes therein to facilitate flow of gases in the IPVD device.

18. A wafer clamp ring assembly according to claim 16, wherein the shield is of a same material as the material deposited on the wafer.

19. A wafer clamp ring assembly according to claim 16, wherein the shield is coated with a material having higher emissivity than the material of the shield.

20. A wafer clamp ring assembly according to claim 16, wherein the shield has a surface with a texture facilitating radiative cooling from said surface.

21. A wafer clamp ring for holding a wafer during a deposition process in an ionized physical vapor deposition (IPVD) device in which a plasma is formed to facilitate deposition of material on the wafer, the wafer clamp ring comprising:

a first portion of a conductive material, the first portion having an annular shape with an inner circumference and an outer circumference and with a gap extending from the inner circumference to the outer circumference, so that the first portion is discontinuous in the circumferential direction; and a second portion of an insulating material disposed in said gap, so that induced current in the wafer clamp ring and heating of the wafer clamp ring due to induced current are avoided.

* * * * *